(12) United States Patent
Hattori

(10) Patent No.: US 6,867,454 B2
(45) Date of Patent: Mar. 15, 2005

(54) POWER SEMICONDUCTOR DEVICE AND MANUFACTURING METHOD THEREOF

(75) Inventor: Hidetaka Hattori, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/961,248

(22) Filed: Sep. 25, 2001

(65) Prior Publication Data

US 2002/0036311 A1 Mar. 28, 2002

(30) Foreign Application Priority Data

Sep. 27, 2000 (JP) ......................................... 2000-294316

(51) Int. Cl.[7] .................. H01L 29/76; H01L 29/94; H01L 31/062; H01L 31/113; H01L 31/119
(52) U.S. Cl. ..................... 257/329; 257/401; 438/212
(58) Field of Search ............................... 257/133, 153, 257/249, 250, 262, 328, 329, 330, 331, 288, 401, 406, 407, 302

(56) References Cited

U.S. PATENT DOCUMENTS

| | | | | |
|---|---|---|---|---|
| 5,973,338 A | * | 10/1999 | Okabe et al. | 257/133 |
| 6,218,709 B1 | * | 4/2001 | Yasuda | 257/378 |
| 6,262,439 B1 | * | 7/2001 | Takeuchi et al. | 257/77 |
| 6,291,865 B1 | * | 9/2001 | Lee | 257/410 |
| 6,300,663 B1 | * | 10/2001 | Kapoor | 257/393 |
| 6,331,466 B1 | * | 12/2001 | Takahashi et al. | 438/268 |

FOREIGN PATENT DOCUMENTS

| | | | | |
|---|---|---|---|---|
| JP | 60268446 | A | * | 6/1987 |
| JP | 362126668 | A | * | 6/1987 |
| JP | 405299639 | A | * | 11/1993 |

* cited by examiner

*Primary Examiner*—Long Pham
*Assistant Examiner*—Dana Farahani
(74) *Attorney, Agent, or Firm*—Oblon, Spivak, McClelland, Maier & Neustadt, P.C.

(57) ABSTRACT

A power semiconductor device includes a base layer of first conductivity. A base layer of second conductivity is selectively formed on one surface of the base layer of first conductivity. An emitter layer or source layer of first conductivity is selectively formed on the surface of the base layer of second conductivity. A collector layer or drain layer is selectively formed on the other surface of the base layer of first conductivity or selectively formed on the one surface thereof. A gate electrode is formed on first and second gate insulating films which are formed on part of the base layer of second conductivity which lies between the emitter layer or source layer of first conductivity and the base layer of first conductivity. The capacitance of a capacitor formed of the second gate insulating film is different from that of a capacitor formed of the first gate insulating film.

40 Claims, 6 Drawing Sheets

POWER SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2000-294316, filed Sep. 27, 2000, the entire contents of which are incorporated herein by reference.

BACKGROUND OF THE INVENTION

1. Field of the Invention

This invention relates to a power MOSFET, IGBT among power semiconductor devices constructing a power converting device such as an inverter and more particularly to a device structure which causes a characteristic of resistance to load short circuit to be enhanced.

2. Description of the Related Art

In order to meet requirements for miniaturizing a power supply device and making the same to have highly sophisticated functions in the recent power electronics field, much attention is paid to the improvement of the characteristics of a power semiconductor device such as the high withstand voltage characteristic, large current characteristic, low loss characteristic, high breakdown voltage characteristic and high speed characteristic. Particularly, from the viewpoint of the high withstand voltage characteristic and large current characteristic, an IGBT which can attain lower turn-ON voltage than a power MOSFET is used as a power semiconductor device having a withstand voltage of approx. 300V or more.

As this type of IGBT, two types of devices, that is, a planar structure in which gates are provided in a flat form and a trench structure in which gates are buried in grooves are widely known.

FIG. 11 is a cross sectional view showing the structure of an IGBT having the planar structure. In the IGBT, a p-type collector layer 102 of high impurity concentration is formed on one surface of an n-type base layer 101 of high resistance, a p-type base layer 106 is selectively formed on the other surface thereof, and an n-type emitter layer 107 is selectively formed on the p-type base layer 106.

A gate oxide film 103 is formed on the n-type base layer 101, part of the p-type base layer 106 and part of the n-type emitter layer 107. Further, an emitter electrode 109 is formed on the p-type base layer 106 and n-type emitter layer 107. A gate electrode 105 is electrically isolated from the emitter electrode 109, n-type base layer 101 and p-type base layer 106 by the presence of the gate oxide film 103 and an interlaid insulating film 104.

An electron injecting MOSFET having a channel region CH is constructed by the n-type base layer 101, p-type base layer 106, n-type emitter layer 107 and gate electrode 105. Further, the emitter electrode 109 is formed on the p-type base layer 106 and n-type emitter layer 107 so as to make contact with both of the layers.

In the IGBT with the conventional planar structure described above, since the n-type emitter layer 107 and p-type base layer 106 are formed by ion implantation of impurities and thermal diffusion thereof, the impurity distributions thereof will correspond to the Gaussian distribution. Therefore, when attention is paid to the impurity concentration distribution along the channel region CH, it is understood that the maximum value of the p-type impurity concentration lies in a position near the junction between the n-type emitter layer 107 and the p-type base layer 106 and the p-type impurity concentration gradually becomes lower in a portion closer to the junction between the p-type base layer 106 and the n-type base layer 101.

Next, the operation of the IGBT is explained. Since the operation principle is substantially the same in the IGBT with the planar structure and the IGBT with the trench structure, the operation of the IGBT with the planar structure is explained below.

If positive voltage which is positive with respect to voltage applied to the emitter electrode 109 is applied to the gate electrode 105 when positive voltage is applied to a collector electrode 108 and negative voltage is applied to the emitter electrode 109, then the surface of the p-type base layer 106 which faces the gate electrode 105 is inverted to an n type and electrons e are injected from the n-type emitter layer 107 into the n-type base layer 101 via the inverted layer and reach the collector layer 102. As a result, the n-type base layer 101 and p-type collector layer 102 are forwardly biased so as to cause holes h to be injected from the p-type collector layer 102 into the n-type base layer 101. Thus, both of the electrons e and holes h are injected into the n-type base layer 101 and conductivity modulation occurs in a region of the n-type base layer 101 to lower the turn-ON voltage. That is, the device is set into the conductive state.

On the other hand, in order to turn OFF the device, voltage which is negative with respect to voltage applied to the emitter electrode 109 is applied to the gate electrode 105. As a result, the inverted layer formed in the surface portion of the p-type base layer 106 which faces the gate electrode 105 disappears and electron injection is interrupted. At this time, part of the holes h stored in the n-type base layer 101 is discharged to the emitter electrode 109 via the p-type base layer 106 and the remaining holes are recombined with electrons e and disappear and thus the device is turned OFF.

If the device is set into a load short circuit condition, the device is set in the conductive state and the power supply voltage is applied to the collector electrode 108. Therefore, a large short circuit peak current (Icp) flows in the device and the device is destroyed after a preset period of time (tsc). In the conventional IGBT, the turn-ON voltage can be lowered by increasing the channel density, but at this time, an increase in the channel density causes a current to easily flow. As a result, there occurs a problem that the short circuit peak current (Icp) becomes larger and the characteristic of resistance to load short circuit (tsc) is degraded.

As described above, in the conventional semiconductor device, a problem that the sufficient characteristic of resistance to load short circuit cannot be attained occurs.

BRIEF SUMMARY OF THE INVENTION

According to a first aspect of this invention, there is provided a power semiconductor device comprising a base layer of a first conductivity type; a base layer of a second conductivity type selectively formed on one surface of the base layer of the first conductivity type; an emitter layer or source layer of the first conductivity type selectively formed on the surface of the base layer of the second conductivity type; a collector layer or drain layer formed on the other surface of the base layer of the first conductivity type or selectively formed on the one surface thereof; a first main electrode formed on the collector layer or drain layer; a second main electrode formed on the emitter layer or source layer of the first conductivity type and on the base layer of the second conductivity type; and a gate electrode formed above part of the base layer of the second conductivity type which lies between the emitter layer or source layer of the first conductivity type and the base layer of the first conductivity type with first and second gate insulating films disposed therebetween; wherein the capacitance of a capacitor formed of the second gate insulating film is different from that of a capacitor formed of the first gate insulating film.

According to a second aspect of this invention, there is provided a manufacturing method of a power semiconductor device comprising forming a base layer of a first conductivity type; selectively forming a base layer of a second conductivity type on one surface of the base layer of the first conductivity type; selectively forming an emitter layer or source layer of the first conductivity type on the surface of the base layer of the second conductivity type; selectively forming a collector layer or drain layer on the other surface of the base layer of the first conductivity type or on the one surface thereof; forming a first main electrode on the collector layer or drain layer; forming a second main electrode on the emitter layer or source layer of the first conductivity type and on the base layer of the second conductivity type; and forming first and second gate insulating films on part of the base layer of the second conductivity type which lies between the emitter layer or source layer of the first conductivity type and the base layer of the first conductivity type and forming a gate electrode on the first and second gate insulating films; wherein the capacitance of a capacitor formed of the second gate insulating film is different from that of a capacitor formed of the first gate insulating film.

DETAILED DESCRIPTION OF THE INVENTION

There will now be described embodiments of this invention with reference to the accompanying drawings.

(First Embodiment)

Figure 1:
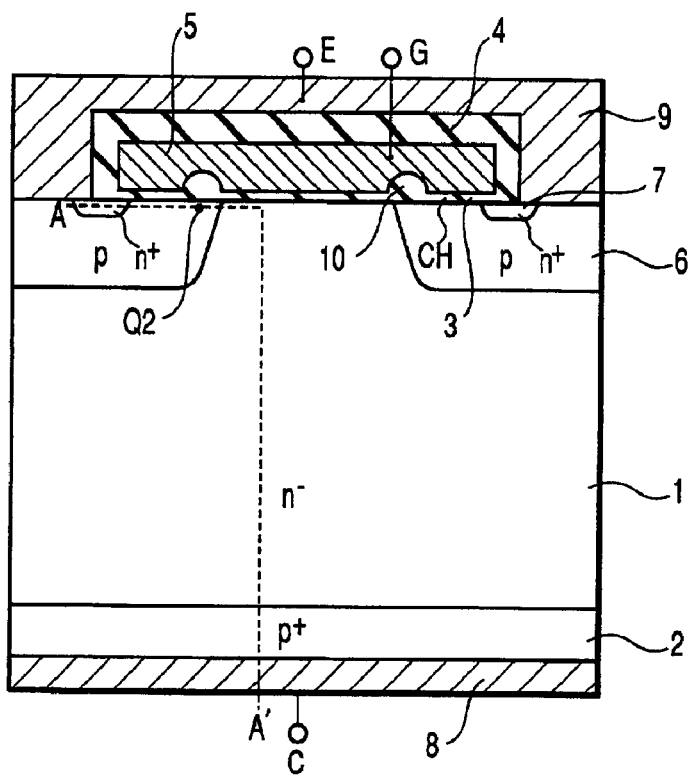
FIG. 1 is a cross sectional view showing a planar IGBT according to a first embodiment of a power semiconductor device of this invention.

FIG. 1 is a cross sectional view of a power semiconductor device according to a first embodiment of this invention. An IGBT having a planar structure is explained below as one example of the power semiconductor device. In all of the following embodiments, an n type is used as a first conductivity type and a p type is used as a second conductivity type.

In FIG. 1, a reference numeral 1 denotes an n-type base layer of high resistance and a p-type collector layer 2 with high impurity concentration is formed on one surface of the n-type base layer 1.

Further, a gate electrode 5 is formed above the other surface of the above structure while a gate insulating film 3 and a gate insulating film 10 formed of the same material as and having different thickness from the gate insulating film 3 are formed therebetween. A p-type base layer 6 is formed on the other surface of the n-type base layer 1. An n-type emitter layer 7 of high impurity concentration is formed on the surface of the p-type base layer 6.

Further, since the p-type base layer 6 is formed by ion implantation of impurity and thermal diffusion thereof, the impurity concentration distribution will correspond to the Gaussian distribution and this applies to a channel region CH.

A MOSFET whose channel CH is formed in the interface between the p-type base layer 6 and the gate insulating films 3, 10 and which injects electrons from the emitter layer 7 into the n-type base layer 1 is constructed by the n-type base layer 1, p-type base layer 6, n-type emitter layer 7, gate insulating films 3, 10 and gate electrode 5.

A collector electrode 8 is formed on the p-type collector layer 2. Further, an emitter electrode 9 is formed on the emitter layer 7 and p-type base layer 6. The emitter layer 7 and p-type base layer 6 are short-circuited by the emitter electrode 9. An interlaid insulating film 4 is formed on the gate electrode 5 so as to isolate the gate electrode 5 from the emitter electrode 9.

Next, the operation of the IGBT is explained. At the turn-ON time, the channel region CH is inverted to an n type to form a channel by applying preset positive gate voltage VGE between the emitter electrode 9 and the gate electrode 5 while collector voltage VCE is kept applied between the emitter electrode 9 and the collector electrode 8. Electrons are injected from the emitter electrode 9 into the n-type base layer 1 via the channel. A portion between the p-type collector layer 2 and the n-type base layer 1 is forwardly biased by the injected electrons so as to cause holes to be injected from the p-type collector layer 2 into the n-type base layer 1. As a result, the resistance of the n-type base layer 1 is extremely lowered by conductivity modulation and the device is set into the conductive state.

On the other hand, in order to turn OFF the device, voltage which is negative with respect to voltage applied to the emitter electrode 9 is applied to the gate electrode 5. As a result, the inverted layer formed in the portion where the p-type base layer 6 is formed in contact with the gate insulating films 3, 10 disappears and electron injection is interrupted. At this time, part of the holes h stored in the n-type base layer 1 is discharged to the emitter electrode 9 via the p-type base layer 6 and the remaining holes h are recombined with electrons e and disappear and thus the device is turned OFF.

If the device is set into a load short circuit condition, the device is set in the conductive state and the power supply voltage is applied to the collector electrode 8. Therefore, a large short circuit peak current (Icp) flows in the device and the device is destroyed after a preset period of time (tsc). A period from the time the load is short-circuited to the time the device is destroyed is the characteristic (tsc) of resistance to load short circuit.

It is confirmed that the characteristic of resistance to load short circuit is degraded when the short circuit peak current of the IGBT becomes larger. The reason is thermal destruction due to the short circuit peak current. In the IGBT with the new structure according to this invention, the characteristic of resistance to load short circuit can be enhanced by reducing the saturation value of a current according to the static characteristic which is substantially the same as that of the short circuit peak current.

The reason why the characteristic of resistance to load short circuit can be enhanced by use of the structure of this invention is described below.

Generally, if the collector voltage VCE applied to the IGBT which is set in the ON state is further increased, a potential of a portion Q2 of the channel portion CH of the p-type base layer 6 rises accordingly and a potential difference between the gate potential and the base potential of the portion Q2 becomes smaller than the threshold voltage so that the inversion layer cannot be maintained, a depletion layer (pinch-off) will be formed, the resistance will become infinite and the current of the IGBT will be saturated. The threshold voltage is inversely proportional to the capacitance of a capacitor formed of the gate insulating film and the threshold voltage is lowered as the capacitance of the capacitor increases.

In the channel portion CH in the present embodiment, since the threshold voltage is determined by the portion Q2 in the p-type base layer 6 which is formed in contact with the gate insulating film 10 having film thickness larger than the gate insulating film 3 rather than a portion of the p-type base layer 6 which is formed in contact with the gate insulating film 3 according to the relation between the threshold voltage and the capacitance of the gate insulating film, pinch-off occurs in the portion Q2 in a region of the p-type base layer 6 which is formed in contact with the gate insulating film 10.

Figure 7:
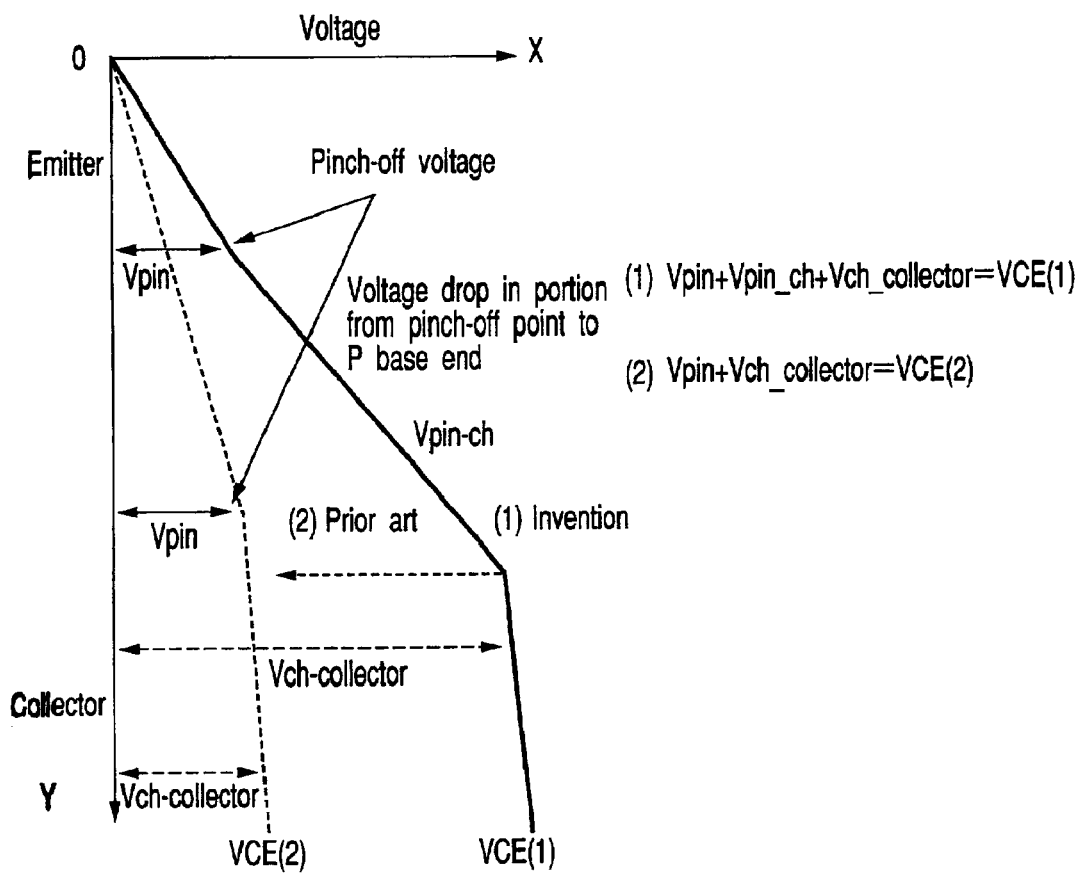
FIG. 7 is a diagram showing the voltage distribution in a portion taken along the A–A' line of the planar IGBT of this invention shown in FIG. 1 in comparison with the voltage distribution in a portion taken along the X–X' line of a conventional planar IGBT shown in FIG. 11.
Figure 11:
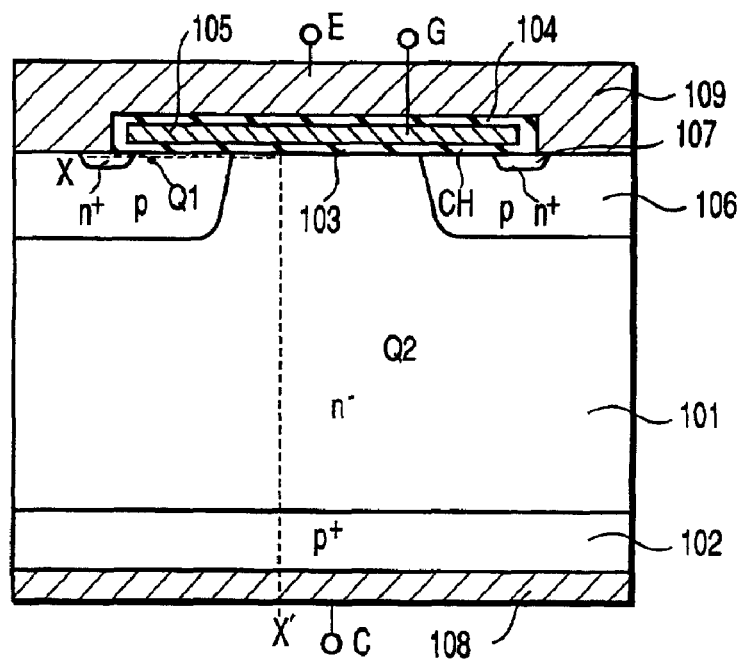
FIG. 11 is a cross sectional view showing the conventional planar IGBT.

Next, the fact that the saturation value of the current of the IGBT of the present invention becomes smaller than the saturation value of the current of the conventional IGBT is explained. FIG. 7 shows the voltage distributions in a portion taken along the X–X' line of FIG. 11 (the planar IGBT of the prior art) and in a portion taken along the A–A' line of FIG. 1 (the planar IGBT of the present invention), the ordinate indicates distance from the emitter electrode 9 to the collector electrode 8 with the boundary between the n-type emitter layer 7 and the emitter electrode 9 set as an origin and the abscissa indicates the voltage with the emitter electrode 9 set as a reference (ground).

As is clearly understood from FIG. 7, in the conventional IGBT, the collector voltage VCE is equal to a total sum $(V_{pin}+V_{pin-ch}+V_{ch-coll}=V_{CE(1)})$ obtained by adding together pinch-off voltage $V_{pin}$, voltage $V_{pin-ch}$ caused by the resistance of a channel portion extending from a pinch-off point Q1 to the n-type base layer 101 and voltage $V_{ch-coll}$ between the n-type base layer 101 and the p-type collector layer 102 and the saturation current of the IGBT varies with the square of the collector voltage VCE.

In this invention, the voltage $V_{pin-ch}$ caused by the resistance of the channel portion extending from the pinch-off point Q2 to the n-type base layer 1 is eliminated by shifting the pinch-off point to the portion Q2 in a region of the p-type base layer 6 which is formed in contact with the gate insulating film 10 and the collector voltage becomes equal to a total sum $(V_{pin}+V_{ch-coll}=V_{CE(2)})$ obtained by adding together pinch-off voltage $V_{pin}$ and voltage $V_{ch-coll}$ between the n-type base layer 1 and the p-type collector layer 2.

Therefore, the collector voltage VCE of the present invention is lower than the collector voltage VCE of the prior art case, and as a result, the saturation current of the IGBT of the present invention becomes smaller than the saturation current of the conventional IGBT.

Figure 8:
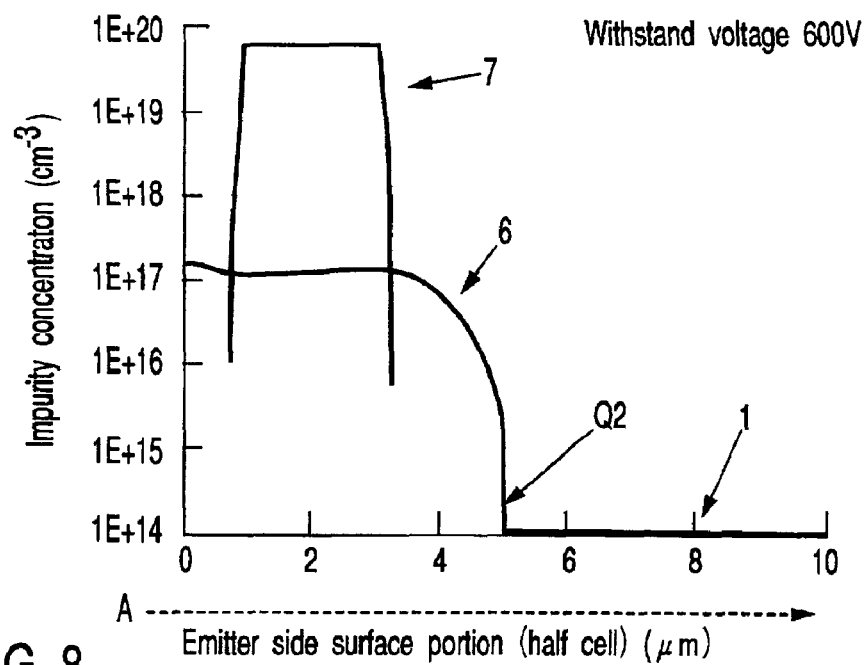
FIG. 8 is a diagram showing the impurity concentration distribution in a portion under the gate insulating film.

FIG. 8 is a diagram showing the impurity concentration distribution in a portion under the gate insulating film and shows the impurity concentrations of the n-type emitter layer 7, p-type base layer 6, n-type base layer 1. As shown in FIG. 8, the impurity concentration of the p-type base layer 6 has distribution corresponding to the Gaussian distribution having a peak on the emitter side on the emitter side in the emitter-side surface portion.

Figure 9:
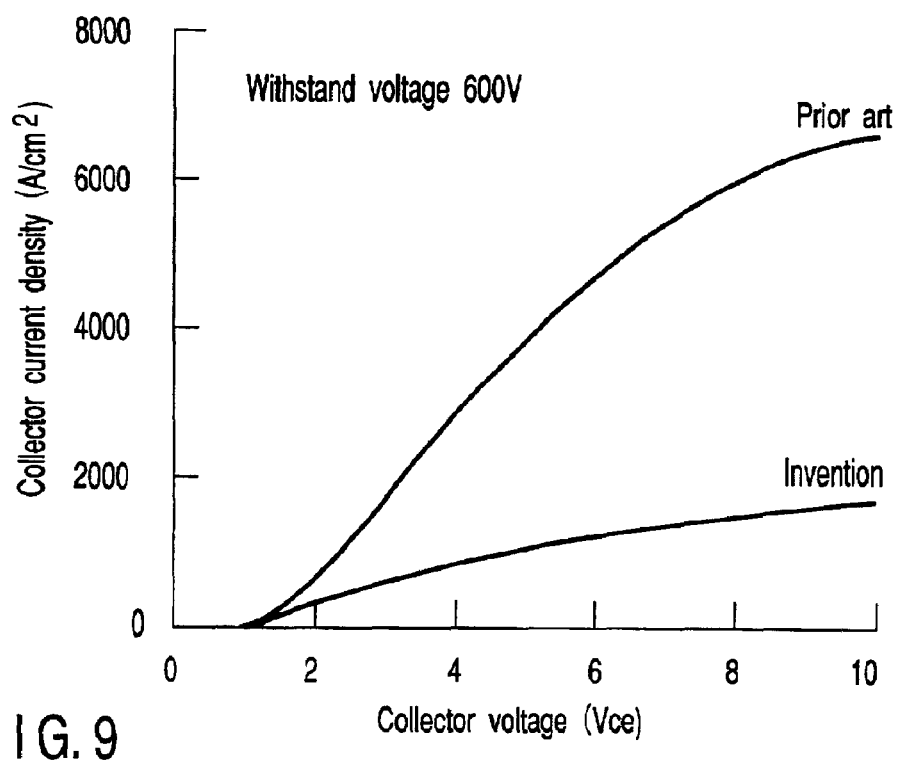
FIG. 9 is a diagram showing the result obtained by simulating the collector voltage-collector current static characteristics of the planar IGBT of this invention shown in FIG. 1 in comparison with the result obtained by simulating the collector voltage-collector current static characteristics of the conventional planar IGBT.

FIG. 9 shows the result obtained by simulation of the above case. More specifically, in the conventional IGBT, the film thickness of the gate insulating film 103 on the p-type base layer 107 is 1000 angstrom and the saturation current obtained at this time is 6800 A/cm$^2$, and in this invention, the saturation current of 1700 A/cm$^2$ can be obtained in a case where the film thickness of the gate insulating film 10 is set to 1 μm while the film thickness of the gate insulating film 3 on the p-type base layer 6 is kept at a film thickness of 1000 angstrom which is the same as the film thickness of the gate insulating film 103 of the conventional IGBT. As the result of the study, it is confirmed that the characteristic (tsc) of resistance to load short circuit (a required period from the time the short circuit peak current Icp starts to flow until the time the operation of the short circuit protection circuit of the device starts) corresponding to the saturation current is equal to or longer than 10 μs.

Therefore, the characteristic of resistance to load short circuit can be enhanced by use of a method of this invention for reducing the saturation current based on the relation between the characteristic of resistance to load short circuit and the saturation current of the IGBT.

(Second Embodiment)

Figure 2:
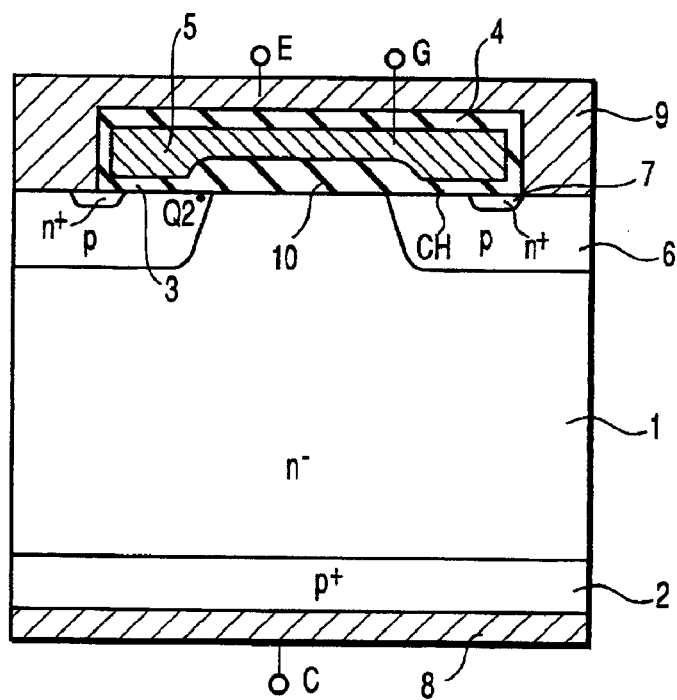
FIG. 2 is a cross sectional view showing a planar IGBT according to a second embodiment of a power semiconductor device of this invention.

FIG. 2 is a cross sectional view showing a power semiconductor device according to a second embodiment of this invention. The present embodiment is different from the first embodiment shown in FIG. 1 in that a gate insulating film which is formed in contact with the surface of the n-type base layer 1 is the gate insulating film 3 in the first embodiment shown in FIG. 1, but in the present embodiment, it is formed of a gate insulating film 10 whose film thickness is larger than that of the gate insulating film 3 (terrace type gate). The operation of the planar IGBT of FIG. 2 is basically the same as the operation of the planar IGBT of FIG. 1 and since the threshold voltage is determined in the region of a p-type base layer 6 formed in contact with the gate insulating film 10, pinch-off occurs in a portion Q2 which lies in the region of the p-type base layer 6 formed in contact with the gate insulating film 10.

In the present embodiment, the capacitance of the capacitor formed of the gate insulating film can be made smaller than in the case of FIG. 1 in which the gate insulating film 3 is formed in the region of the n-type base layer 1 by forming the gate insulating film 10 as the gate insulating film which is formed in contact with the region of the n-type base layer 1. As a result, times required for the turn ON and turn OFF can be reduced in comparison with the case of FIG. 1. Further, the manufacturing process can be further simplified.

(Third Embodiment)

Figure 3:
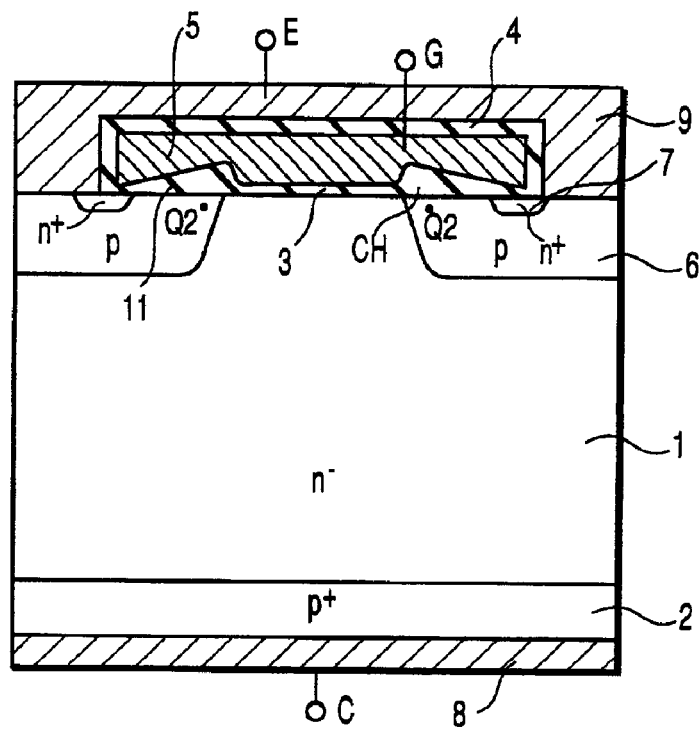
FIG. 3 is a cross sectional view showing a planar IGBT according to a third embodiment of a power semiconductor device of this invention.

FIG. 3 is a cross sectional view showing a power semiconductor device according to a third embodiment of this invention. The present embodiment is different from the first embodiment shown in FIG. 1 in that the gate insulating film 3 of FIG. 1 corresponds to a gate oxide film 11 having an inclination as shown in FIG. 3 in the present embodiment. The gate insulating film 11 has a feature that the film thickness of a portion of the gate insulating film which lies on the junction between a p-type base layer 6 and an n-type base layer 1 is larger than the film thickness of a portion of the gate insulating film which lies on the junction between the p-type base layer 6 and an n-type emitter layer 7 and gradually becomes smaller in a portion closer to the junction between the p-type base layer 6 and the n-type emitter layer 7.

The operation of the planar IGBT of FIG. 3 is basically the same as the operation of the planar IGBT of FIG. 1. In the present embodiment, since the film thickness of the gate insulating film 11 becomes larger towards the junction between the p-type base layer 6 and the n-type base layer 1, the threshold voltage gradually becomes higher in a portion closer to the junction between the p-type base layer 6 and the n-type base layer 1. Therefore, like the planar IGBT of FIG. 1, pinch-off occurs in a portion Q2 and the characteristic of resistance to load short circuit can be enhanced for the same reason as the reason why the characteristic of resistance to load short circuit can be enhanced in the first embodiment.

(Fourth Embodiment)

Figure 4:
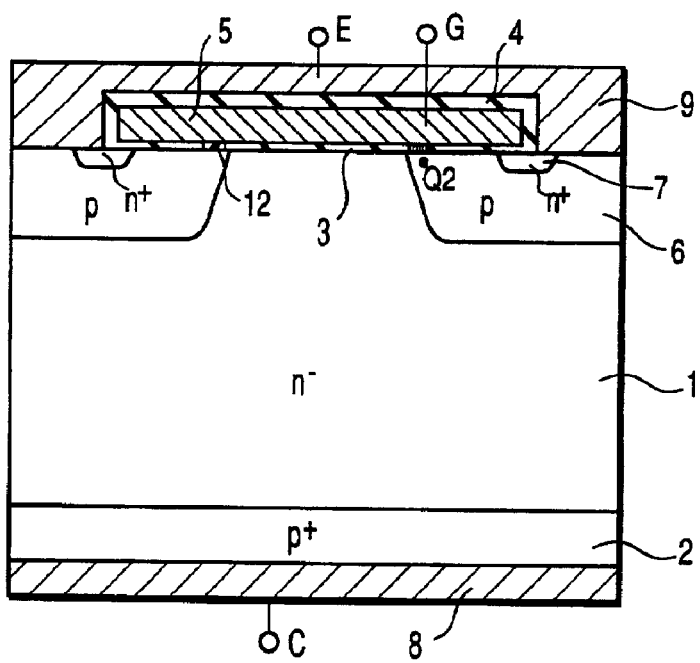
FIG. 4 is a cross sectional view showing a planar IGBT according to a fourth embodiment of a power semiconductor device of this invention.

FIG. 4 is a cross sectional view showing a power semiconductor device according to a fourth embodiment of this invention. The present embodiment of FIG. 4 is different from the first embodiment shown in FIG. 1 in that the gate insulating films 3 and 10 are formed of the same material and the dielectric constants thereof are the same in FIG. 1, but in the present embodiment of FIG. 4, gate insulating films 3 and 12 are formed of different materials and the dielectric constants thereof are different. As one example of the gate insulating films of the present embodiment, for example, the gate insulating film 3 is formed of tantalum pentoxide ($Ta_2O_5$) (dielectric constant: 22) or silicon nitride ($Si_3N_4$) (dielectric constant: 7) and the gate insulating film 12 is formed of silicon dioxide ($SiO_2$) (dielectric constant: 3.9). As a result, even if the two gate insulating films 3 and 12 have the same film thickness, the capacitances of the capacitors formed of the two gate insulating films become different. The threshold voltage is determined by the gate insulating film 12 having the smaller capacitance than the gate insulating film 3 and pinch-off occurs in a portion Q2 in the channel region CH of the p-type base layer 6 formed in contact with the gate insulating film 12.

Therefore, the characteristic of resistance to load short circuit can be enhanced for the same reason as the reason why the characteristic of resistance to load short circuit can be enhanced in the first embodiment.

(Fifth Embodiment)

Figure 5:
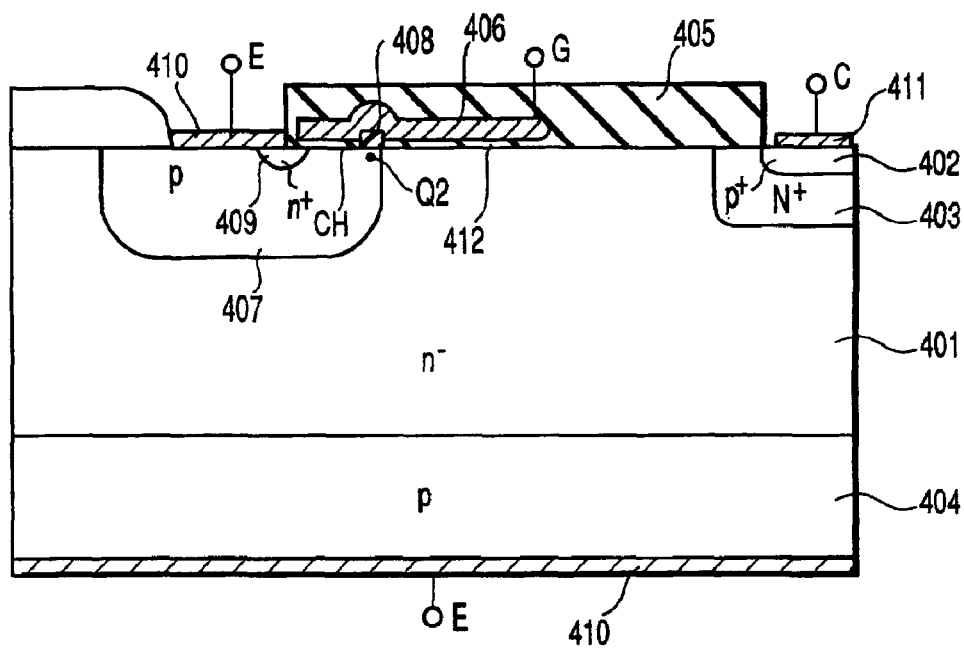
FIG. 5 is a cross sectional view showing a planar IGBT according to a fifth embodiment of a power semiconductor device of this invention.

FIG. 5 is a cross sectional view showing a power semiconductor device (lateral IGBT) according to a fifth embodiment of this invention. In FIG. 5, a reference numeral 401 denotes an n-type base layer of high resistance, a p-type substrate layer 404 is formed on one surface of the n-type base layer 401, and an emitter electrode 410 is formed on the p-type substrate layer 404. Further, a p-type base layer 407 is selectively formed on the other surface of the n-type base layer 401 and an n-type emitter layer 409 of high impurity concentration is selectively formed on the surface of the p-type base layer 407. Also, an n-type buffer layer 403 is selectively formed on the other surface of the n-type base layer 401, a p-type collector layer 402 of high impurity concentration is selectively formed on the surface of the n-type buffer layer 403 and a collector electrode 411 is formed in contact with the p-type collector layer 402.

A gate insulating film 412 is formed on part of the p-type base layer 407, p-type base layer 408, part of the n-type base layer 401 and n-type buffer layer and a gate insulating film 408 is formed on part of the p-type base layer 407. The gate insulating film 408 has different thickness or different dielectric constant from the gate insulating film 412, and therefore, the capacitances of capacitors formed of the above gate insulating films are different from each other. A gate electrode 406 is formed on the gate insulating films 412 and 408. An interlaid insulating film 405 is formed on the gate electrode 406 and the emitter electrode 410 is formed in contact with part of the n-type emitter layer 409 and part of the p-type base layer 407 via a contact hole formed in the interlaid insulating film 405. The gate electrode 406 is isolated from the emitter electrode 410, collector electrode 411, n-type base layer 401 and p-type base layer 407 by use of the gate insulating films 412 and 408 and interlaid insulating film 405.

The operation of the lateral IGBT of FIG. 5 is basically the same as the operation of the planar IGBT of FIG. 1. In the present embodiment, the threshold voltage is determined by a portion Q2 in the channel portion CH of the p-type base layer 407 under the gate insulating film 408. Therefore, like the planar IGBT of FIG. 1, pinch-off occurs in the portion Q2 and the characteristic of resistance to load short circuit can be enhanced for the same reason as the reason why the characteristic of resistance to load short circuit can be enhanced in the first embodiment.

(Sixth Embodiment)

Figure 6:
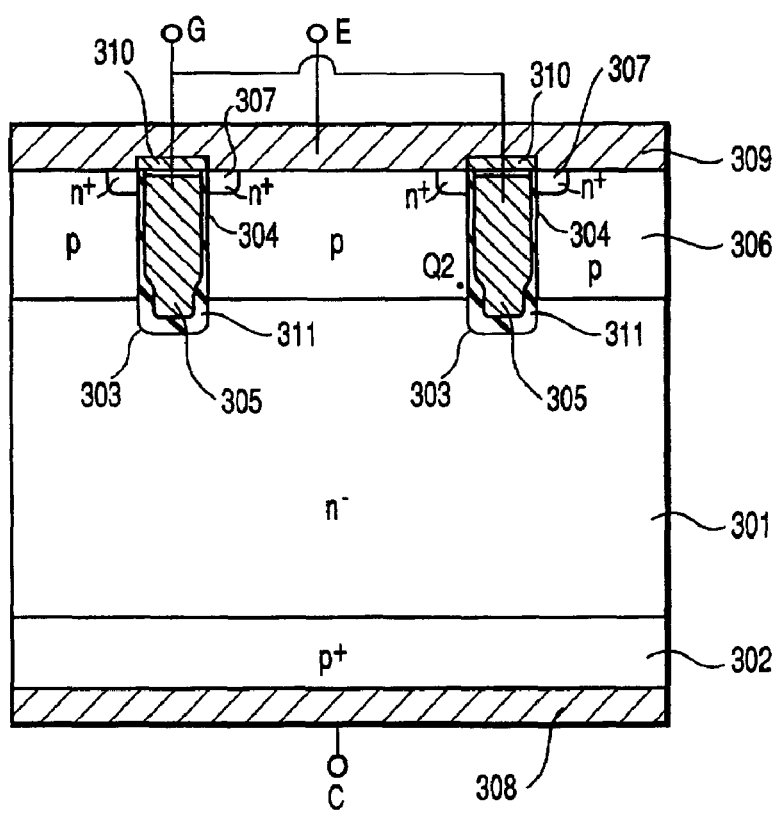
FIG. 6 is a cross sectional view showing a planar IGBT according to a sixth embodiment of a power semiconductor device of this invention.

FIG. 6 is a cross sectional view showing a power semiconductor device (trench IGBT) according to a sixth embodiment of this invention.

In FIG. 6, a reference numeral 301 denotes an n-type base layer of high resistance and a p-type collector layer 302 of high impurity concentration is formed on one surface of the n-type base layer 301.

Further, a gate electrode 305 is buried and formed in each of trenches 303 with gate insulating films 304 and 311 disposed therebetween. A p-type base layer 306 of high impurity concentration is formed on the surface of the n-type base layer 301 in each region between the trenches 303.

Also, n-type emitter layers 307 of high impurity concentration are formed on the surface of the p-type base layer 306. MOSFETs whose channels CH are formed on the surface portions of the p-type base layer 306 which are formed in contact with the respective trenches 303 and which inject electrons from the n-type emitter layers 307 into the n-type base layer 301 are constructed by the n-type base layer 301, p-type base layer 306, n-type emitter layers 307, gate insulating films 304, 311 and gate electrodes 305.

A collector electrode 308 is formed on the p-type collector layer 302. Further, an emitter electrode 309 is formed on the p-type base layer 306 and n-type emitter layers 307. The p-type base layer 306 and n-type emitter layers 307 are short-circuited via the emitter electrode 309. Interlaid insulating films 310 are formed on the gate electrodes 305 so as to electrically isolate the gate electrodes 305 from the emitter electrode 309.

Next, the operation of the above IGBT is explained. At the turn-ON time, the channel region CH is inverted to an n type to form a channel CH when preset positive gate voltage VGE is applied between the emitter electrode 309 and the gate electrode 305 while collector voltage VCE is kept applied between the emitter electrode 309 and the collector electrode 308. Electrons are injected from the emitter electrode 309 into the n-type base layer 301 via the channel CH. A portion between the p-type collector layer 302 and the n-type base layer 301 is forwardly biased by the injected electrons so as to cause holes to be injected from the p-type collector layer 302 into the n-type base layer 301. As a result, the resistance of the n-type base layer 301 is extremely lowered by conductivity modulation and the device is set into the conductive state.

On the other hand, in order to turn OFF the device, voltage which is negative with respect to voltage applied to the emitter electrode 309 is applied to the gate electrode 305. As a result, the inverted layer formed in the portion where the p-type base layer 306 faces the gate electrode 305 disappears and electron injection is interrupted. At this time, part of the holes h stored in the n-type base layer is discharged to the emitter electrode 309 via the p-type base layer 306 and the remaining holes h are recombined with electrons e and disappear and thus the device is turned OFF.

If the device is set into a load short circuit condition, the device is set in the conductive state and the power supply voltage is applied to the collector electrode 308, and as a result, a short circuit peak current (Icp) flows in the device and the device is destroyed after a preset period of time (tsc). A period from the time the short circuit occurs to the time the device is destroyed is the characteristic (tsc) of resistance to load short circuit.

It is confirmed that the characteristic of resistance to load short circuit is degraded when the short circuit peak current of the IGBT becomes larger. The reason is thermal destruction due to the short circuit peak current. In the IGBT with the new structure according to this invention, the characteristic of resistance to load short circuit can be enhanced by reducing the saturation value of a current according to the static characteristic which is substantially the same as that of the short circuit peak current.

The reason why the characteristic of resistance to load short circuit can be enhanced by use of the structure of this invention is described below.

Generally, if the collector voltage VCE applied to the IGBT which is set in the ON state is further increased, a potential of a portion Q2 of the channel portion CH of the p-type base layer 306 rises accordingly and a potential difference between the gate potential and the base potential of the portion Q2 becomes smaller than the threshold voltage so that the inversion layer cannot be maintained, a depletion layer (pinch-off) will be formed, the resistance will become infinite and the current of the IGBT will be saturated. In the present embodiment, the threshold voltage is determined by the gate insulating film 311 in the channel portion CH for the same reason described in the first embodiment. Therefore, pinch-off occurs in the portion Q2 of the p-type base layer 306 which is set in contact with the gate insulating film 311.

Next, the fact that the saturation value of the current of the IGBT of the present invention becomes smaller than the saturation value of the current of the conventional IGBT is explained.

In this invention, the voltage $V_{pin\text{-}ch}$ caused by the resistance of the channel portion extending from the pinch-off point to the n-type base layer 307 is eliminated by shifting the pinch-off point to a portion of the p-type base layer 306 which is set in contact with the gate insulating film 311, and as a result, the collector voltage can be made equal to a total sum $(V_{pin}+V_{ch\text{-}coll}=V_{CE(2)})$ obtained by adding together pinch-off voltage $V_{pin}$ and voltage $V_{ch\text{-}coll}$ between the n-type base layer 301 and the p-type collector layer 302. Therefore, the collector voltage VCE of the present invention is lower than the collector voltage VCE of the prior art case, and therefore, the saturation current of the IGBT of the present invention becomes smaller than the saturation current of the conventional IGBT. Thus, the characteristic of resistance to load short circuit can be enhanced.

(Seventh Embodiment)

Figure 10:
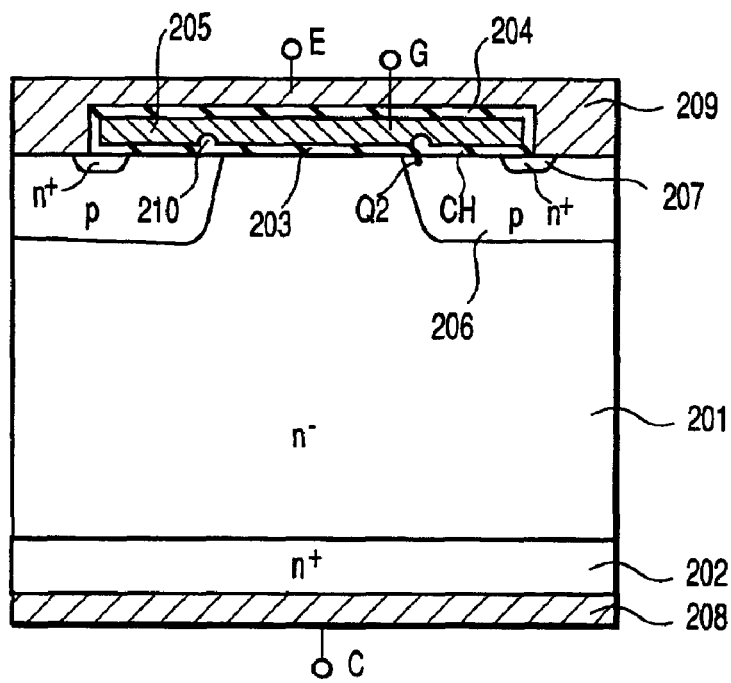
FIG. 10 is a cross sectional view showing a planar IGBT according to a seventh embodiment of a power semiconductor device of this invention.

FIG. 10 is a cross sectional view showing a power semiconductor device (power MOSFET) according to a seventh embodiment of this invention.

A power MOSFET of FIG. 10 is similar to the planar IGBT of FIG. 1 except that a drain layer 202 formed of n-type impurity is used instead of the collector layer 2 formed of p-type impurity, a drain electrode 208 is used instead of the collector electrode 8, an n-type source layer 207 is used instead of the n-type emitter layer 7, and a source electrode 209 is used instead of the emitter electrode 9.

Generally, if drain voltage VSD applied to the power MOSFET which is set in the ON state is further increased, a potential of a portion Q2 of the channel portion CH of a p-type base layer 206 rises accordingly and a potential difference between the gate potential and the base potential of the portion Q2 becomes smaller than the threshold voltage so that an inversion layer cannot be maintained, a depletion layer (pinch-off) will be formed, the resistance will become infinite and the current of the power MOSFET will be saturated. In the present embodiment, the threshold voltage is determined by the gate insulating film 210 in the channel portion CH for the same reason described in the first embodiment. Therefore, pinch-off occurs in the portion Q2 of the p-type base layer 206 which is set in contact with the gate insulating film 210.

Next, the fact that the saturation value of the current of the power MOSFET of the present invention becomes smaller than the saturation value of the current of the conventional power MOSFET is explained.

In this invention, voltage $V_{pin\text{-}ch}$ caused by the resistance of the channel portion extending from the pinch-off point to the n-type source layer 207 is eliminated by shifting the pinch-off point to a portion of the p-type base layer 206 which is set in contact with the gate insulating film 210, and as a result, the collector voltage can be made equal to a total sum $(V_{pin}+V_{ch\text{-}coll}=V_{CE(2)})$ obtained by adding together pinch-off voltage $V_{pin}$ and voltage $V_{ch\text{-}coll}$ between the n-type base layer 201 and the p-type drain layer 202. Therefore, the drain voltage VSD of the present invention is lower than the drain voltage VSD of the prior art case, and as a result, the saturation current of the power MOSFET of the present invention becomes smaller than the saturation current of the conventional power MOSFET. Thus, the characteristic of resistance to load short circuit can be enhanced.

As described above, according to the present invention, it is possible to provide a power semiconductor device which can attain a high resistance characteristic to load short circuit by suppressing a short circuit peak current caused at the time of load short circuit while maintaining low turn-ON voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor devices comprising:
   a base layer of a first conductivity type;
   a base layer of a second conductivity type selectively formed on one surface of said base layer of the first conductivity type;
   an emitter layer of the first conductivity type selectively formed on the surface of said base layer of the second conductivity type;
   a collector layer selectively formed on one of the one surface and another surface of said base layer of the first conductivity type;
   a first main electrode formed on said collector layer;
   a second main electrode formed on said emitter layer and on said base layer of the second conductivity type;
   a gate insulating film formed on and directly contacting a surface of said base layer of the second conductivity type that lies between said emitter layer and said base layer of the first conductivity type, said gate insulating film including a first insulating portion and a second insulating portion; and
   a gate electrode formed above said first and second insulating portions,
   wherein a capacitance of a capacitor formed of the second insulating portion is smaller than a capacitance of a capacitor formed of the first insulating portion.

2. The power semiconductor device according to claim 1, wherein the first insulating portion is formed in a portion near said emitter layer, and the second insulating portion is formed in a portion near said base layer of the first conductivity type.

3. The power semiconductor device according to claim 2, wherein a thickness of the second insulating portion is larger than a thickness of the first insulating portion.

4. The power semiconductor device according to claim 2, wherein a dielectric constant of the second insulating portion is smaller than a dielectric constant of the first insulating portion.

5. The power semiconductor device according to claim 2, wherein a thickness of the second insulating portion has an inclination and the thickness thereof on a side of said emitter layer is smaller than a thickness on a side of said base layer of the first conductivity type.

6. The power semiconductor device according to claim 1, wherein said gate electrode is buried in a trench with the first and second insulating portions disposed therebetween to form a trench structure, the french being formed to range from a surface of said emitter layer to an intermediate portion of said base layer of the first conductivity type via said base layer of the second conductivity type.

7. The power semiconductor device according to claim 2, wherein said gate electrode is buried in a trench with the first and second insulating portions disposed therebetween to form a trench structure, the trench being formed to range from a surface of said emitter layer to an internediate portion of said base layer of the first conductivity type via said base layer of the second conductivity type.

8. The power semiconductor device according to claim 3, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

9. The power semiconductor device according to claim 4, wherein said gate electrode is buried ma trench with the first and second insulating portions disposed therebetween to form a trench structure, the trench being formed to range from a surface of said emitter layer to an intermediate portion of said base layer of the first conductivity type via said base layer of the second conductivity type.

10. The power semiconductor device according to claim 5, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

11. A method of manufacturing a power semiconductor device, comprising:
   forming a base layer of a first conductivity type;
   selectively forming a base layer of a second conductivity type on one surface of the base layer of the first conductivity type;
   selectively forming an emitter layer of the first conductivity type on a surface of the base layer of the second conductivity type;
   selectively forming a collector layer on one of the one surface and another surface of the base layer of the first conductivity type;
   forming a first main electrode on said collector layer;
   forming a second main electrode on said emitter layer and on the base layer of the second conductivity type;
   forming a gate insulating film on a surface of and in direct contact with the base layer of the second conductivity type that lies between said emitter layer and the base layer of the fist conductivity type, said gate insulating film including a first insulating portion and a second insulating portion; and
   forming a gate electrode above said first and second insulating portions,
   wherein a capacitance of a capacitor formed of the second insulating portion is smaller than a capacitance of a capacitor formed of the first insulating portion.

12. The method of manufacturing a power semiconductor device according to claim 11, wherein the first insulating portion is formed in a portion near said emitter layer and the second insulating portion is formed in a portion near said base layer of the first conductivity type.

13. The method of manufacturing a power semiconductor device according to claim 12, wherein a thickness of the second insulating portion is larger than a thickness of the first insulating portion.

14. The method of manufacturing a power semiconductor device according to claim 12, wherein a dielectric constant of the second insulating portion is smaller than a dielectric constant of the first insulating portion.

15. The method of manufacturing a power semiconductor device according to claim 12, wherein a thickness of the second insulating portion has an inclination and the thickness thereof on a side of said emitter layer is smaller than a thickness on a side of said base layer of the first conductivity type.

16. The method of manufacturing a power semiconductor device according to claim 11, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

17. The method of manufacturing a power semiconductor device according to claim 12, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

18. The method of manufacturing a power semiconductor device according to claim 13, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

19. The method of manufacturing a power semiconductor device according to claim 14, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

20. The method of manufacturing a power semiconductor device according to claim 15, wherein said gate electrode is buried in a trench with the first and second insulating portions disposed therebetween to form a trench structure, the trench being formed to range from a surface of said emitter layer to an intermediate portion of said base layer of the first conductivity type via said base layer of the second conductivity type.

21. A power semiconductor device, comprising:
   a base layer of a first conductivity type;
   a base layer of a second conductivity type selectively formed on one surface of said base layer of the first conductivity type;
   a source layer of the first conductivity type selectively formed on the surface of said base layer of the second conductivity type;
   a drain layer selectively formed on one of the one surface and another surface of said base layer of the first conductivity type;
   a first main electrode formed on said drain layer;
   a second main electrode formed on said source layer and on said base layer of the second conductivity type;
   a gate insulating film formed on and directly contacting a surface of said base layer of the second conductivity type that lies between said source layer and said base layer of the first conductivity type, said gate insulating film including a first insulating portion and a second insulating portion; and
   a gate electrode formed above said first and second insulating portions,
   wherein a capacitance of a capacitor formed of the second insulating portion is smaller than a capacitance of a capacitor formed of the first insulating portion.

22. The power semiconductor device according to claim 21, wherein the first insulating portion is formed in a portion near said one of said source layer, and the second insulating portion is formed in a portion near said base layer of the first conductivity type.

23. The power semiconductor device according to claim 22, wherein a thickness of the second insulating portion is larger than a thickness of the first gate insulating film.

24. The power semiconductor device according to claim 22, wherein a dielectric constant of the second insulating portion is smaller than a dielectric constant of the first gate insulating film.

25. The power semiconductor device according to claim 22, wherein a thickness of the second insulating portion has an inclination and the thickness thereof on a side of said source layer is smaller than a thickness on a side of said base layer of the first conductivity type.

26. The power semiconductor device according to claim 21, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

27. The power semiconductor device according to claim 22, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

28. The power semiconductor device according to claim 23, wherein said gate electrode is buried in a trench with the first and second insulating portions disposed therebetween to form a trench structure, the trench being formed to range from a surface of said source layer to an internediate portion of said base layer of the first conductivity type via said base layer of the second conductivity type.

29. The power semiconductor device according to claim 24, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

30. The power semiconductor device according to claim 25, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

31. A method of manufacturing a power semiconductor device, comprising:
   forming a base layer of a first conductivity type;
   selectively forming a base layer of a second conductivity type on one surface of the base layer of the first conductivity type;
   selectively forming a source layer of the first conductivity type on a surface of the base layer of the second conductivity type;
   selectively forming a drain layer on one of the one surface and another surface of the base layer of the first conductivity type;
   forming a first main electrode on the drain layer;
   forming a second maim electrode on the source layer of the first conductivity type and on the base layer of the second conductivity type;
   forming a gate insulating film on and in direct contact with a surface of the base layer of the second conductivity type that lies between the source layer of the first conductivity type and the base layer of the first conductivity type, said gate insulating film including a first insulating portion and a second insulating portion; and forming a gate electrode above said first and second insulating portions, wherein a capacitance of a capacitor formed of the second insulating portion is smaller than a capacitance of a capacitor formed of the first insulating portion.

32. The method of manufacturing a power semiconductor device according to claim 31, wherein the first insulating portion is fanned in a portion near said source layer and the second insulating portion is formed in a portion near said base layer of the first conductivity type.

33. The method of manufacturing a power semiconductor device according to claim 32, wherein a thickness of the second insulating portion is larger than a thickness of the first insulating portion.

34. The method of manufacturing a power semiconductor device according to claim 32, wherein a dielectric constant of the second insulating portion is smaller than a dielectric constant of the first gate insulating film.

35. The method of manufacturing a power semiconductor device according to claim 32, wherein a thickness of the second insulating portion has an inclination and the thickness thereof on a side of said source layer is smaller than a thickness on a side of said base layer of the first conductivity type.

36. The method of manufacturing a power semiconductor device according to claim 31, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

37. The method of manufacturing a power semiconductor device according to claim 32, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

38. The method of manufacturing a power semiconductor device according to claim 33, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

39. The method of manufacturing a power semiconductor device according to claim 34, wherein said gate electrode is buried in a trench with the first and second insulating portions disposed therebetween to form a trench structure, the trench being formed to range from a surface of said source layer to an intermediate portion of said base layer of the first conductivity type via said base layer of the second conductivity type.

40. The method of manufacturing a power semiconductor device according to claim 35, wherein said gate electrode is burled in a trench with the first and second insulating portions disposed therebetween to form a trench structure, the trench being formed to range from a surface of said source layer to an intermediate portion of said base layer of the first conductivity type via said base layer of the second conductivity type.

* * * * *